US006366174B1

United States Patent
Berry et al.

(10) Patent No.: US 6,366,174 B1
(45) Date of Patent: Apr. 2, 2002

(54) METHOD AND APPARATUS FOR PROVIDING A CLOCK GENERATION CIRCUIT FOR DIGITALLY CONTROLLED FREQUENCY OR SPREAD SPECTRUM CLOCKING

(75) Inventors: John B. Berry, Lexington; James R. Booth, Nicholasville; Keith B. Hardin; John P. Richey, both of Lexington, all of KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/510,124

(22) Filed: Feb. 21, 2000

(51) Int. Cl.[7] ............................................... H03L 7/085
(52) U.S. Cl. .......................... 331/78; 331/1 A; 331/18; 327/106; 327/159; 375/376; 375/200
(58) Field of Search ........................ 331/18, 78, 1 A; 327/106, 159; 375/376, 200

(56) References Cited

U.S. PATENT DOCUMENTS

| 4,965,533 A | 10/1990 | Gilmore ...................... 331/18 |
| 5,028,887 A | 7/1991 | Gilmore ...................... 331/18 |
| 5,055,800 A | 10/1991 | Black et al. ................. 331/1 A |
| 5,059,924 A | 10/1991 | JenningsCheck ............ 331/1 A |
| 5,130,671 A | 7/1992 | Shahriary et al. ............. 331/16 |
| 5,180,993 A | 1/1993 | Dent ............................ 331/16 |
| 5,329,253 A | 7/1994 | Ichihara ...................... 331/17 |
| 5,477,330 A | 12/1995 | Dorr ........................... 358/296 |
| 5,488,627 A | 1/1996 | Hardin et al. ............... 375/204 |
| 5,493,700 A | 2/1996 | Hietala et al. ................. 455/75 |
| 5,495,206 A | 2/1996 | Hietala ....................... 331/1 A |
| 5,495,505 A | 2/1996 | Kundmann .................. 375/308 |
| 5,508,659 A | 4/1996 | Brunet et al. ................. 331/16 |
| 5,576,666 A | 11/1996 | Rauvola ...................... 331/25 |
| 5,610,651 A | 3/1997 | Yamakawa et al. ......... 347/250 |
| 5,631,587 A | 5/1997 | Co et al. ..................... 327/107 |
| 5,631,920 A | 5/1997 | Hardin ........................ 375/200 |
| 5,651,035 A | 7/1997 | Tozun et al. ................. 375/373 |
| 5,694,089 A | 12/1997 | Adachi et al. ................. 331/16 |
| 5,701,598 A | 12/1997 | Atkinson ................. 455/161.2 |
| 5,714,896 A | 2/1998 | Nakagawa et al. ......... 327/115 |

(List continued on next page.)

Primary Examiner—Arnold Kinkead
(74) Attorney, Agent, or Firm—John A. Brady

(57) ABSTRACT

An improved clock generation circuit is provided that operates with a single input clock frequency, and includes a Phase Locked Loop circuit (PLL) with a digital accumulator in the feedback loop, in which either the Most Significant Bit or the Carry Bit of the binary adder is used as the modulated feedback clock to the phase/frequency detector of the PLL. In one embodiment, a fixed add/phase amount is used to drive one of the inputs of the binary adder to generate a fixed output frequency. If it is desired to modulate the output frequency, then an Add Amount Modulator circuit can be provided that presents a varying numeric value to one of the inputs of the binary adder. The MSB or Carry Bit is communicated to an address look-up table, which then outputs an address to a memory circuit, which in turn presents a different add amount to the binary adder. If a periodic modulation is desired, the address look-up table will point to add amounts that create a particular periodic output frequency profile, which could include a Spread Spectrum profile. Certain optional circuits may be included, such as: a pre-multiply or pre-divide circuit to either increase or decrease the frequency of the input clock signal before it reaches the phase/frequency detector of the PLL; an output divider to provide a lower output clock frequency; a feedback divider to lower the VCO's output frequency before it is directed into the digital accumulator; a synchronizing input (Sync Input); a synchronizing output (Sync Output); a Base Number register to keep the memory size of the look-up table to a reasonably small value; or a Start Number register to provide the add amount upon initialization.

18 Claims, 5 Drawing Sheets

U.S. PATENT DOCUMENTS

| | | | |
|---|---|---|---|
| 5,719,510 A | 2/1998 | Weidner | 327/119 |
| 5,757,239 A | 5/1998 | Gilmore | 331/18 |
| 5,764,711 A | 6/1998 | Jokura | 375/376 |
| 5,777,521 A | 7/1998 | Gillig et al. | 331/16 |
| 5,796,392 A | 8/1998 | Eglit | 345/213 |
| 5,867,524 A | 2/1999 | Booth et al. | 375/200 |
| 5,872,487 A * | 2/1999 | Adachi et al. | 331/1 A |
| 5,872,807 A | 2/1999 | Booth et al. | 375/200 |
| 6,006,008 A | 12/1999 | Klaffenbach et al. | 388/813 |
| 6,198,353 B1 * | 3/2001 | Janesch et al. | 331/16 |

* cited by examiner

METHOD AND APPARATUS FOR PROVIDING A CLOCK GENERATION CIRCUIT FOR DIGITALLY CONTROLLED FREQUENCY OR SPREAD SPECTRUM CLOCKING

TECHNICAL FIELD

The present invention relates generally to image forming, computing, or microprocessor-based equipment and is particularly directed to clock generators of the type which exhibit low frequency drift. The invention is specifically disclosed as a Direct Digital Synthesizer circuit that uses a digital accumulator's MSB or its Carry bit to modulate a feedback clock signal to the phase/frequency detector of a Phase Locked Loop.

BACKGROUND OF THE INVENTION

Phase locked loop circuits have been used as clock generators in the past so that different output frequencies can be generated from a fixed input frequency, such as a clock signal from a crystal clock oscillator. Certain Phase Locked Loop circuits have also been used in the past to create a Spread Spectrum Clock Generator, which again provides frequencies that are different from the input frequency provided by a crystal oscillator. In U.S. Pat. No. 4,965,533, the phase detector of the Phase Locked Loop outputs a continuous position error value between a maximum positive error and a maximum negative error. This phase detector is an analog phase detector, in which the maximum positive error could be a DC voltage at +V, the maximum negative error could be a DC voltage at −V, and no error would be represented by zero (0) VDC.

Other clock circuits using Phase Locked Loops have also been provided in the past in which an accumulator creates an address to a look-up table in a ROM, and the ROM outputs a sine wave phase address that will drive into a digital-to-analog converter. The output of the digital-to-analog converter will then be a voltage sine wave that is used to drive an analog phase detector of the Phase Locked Loop circuit.

Another prior circuit uses a Direct Digital Synthesizer in the feed-forward path of a Spread Spectrum Clock Generator. Such a circuit is disclosed in U.S. Pat. No. 5,488,627, owned by Lexmark International, Inc. (the Assignee of the present invention).

In certain applications, such as laser printers, a highly accurate clock is used to generate video pulses and to perform pulse width modulation on these pulses. These video pulses can represent pixels, and drive the laser diode of a laser printhead. Since the laser diode produces images on a photoconductive member that is used to deposit toner on a printed page, the pulse placement within a pixel location on a page determines the appearance of the image. Moreover, the video pulse width determines the darkness of this printed image.

The frequency of the pel/slice clock is determined by the scan rate of the laser, which is the speed that the laser beam moves across the photoconductive drum due to the laser beam striking a rotating mirror. Different laser printers, however, scan the laser at different rates. Therefore, different printer designs will typically require a different clock frequency to generate the video signals. Because of this factor, most laser printers contain a unique crystal clock and a standard Phase Locked Loop circuit to produce the video clock signals. Any change in the video clock frequency for a different printer design will require a new crystal (or other type of clock source) to be supplied. This usually takes several weeks, and can delay the start of production of a new design.

SUMMARY OF THE INVENTION

Accordingly, it is a primary advantage of the present invention to provide a clock generation circuit that allows the use of a standard input clock frequency to produce an output clock signal that can have a highly selectable output frequency. It is another advantage of the present invention to provide a clock circuit that uses a standard input frequency to create a Spread Spectrum Clock Generator that will operate at different frequency ranges using the same hardware components. It is a further advantage of the present invention to provide a clock circuit with optional frequency multiply or frequency divide circuits that can be used to produce a clock of any frequency for digital logic circuits, even though the input source is a standard fixed clock frequency.

Additional advantages and other novel features of the invention will be set forth in part in the description that follows and in part will become apparent to those skilled in the art upon examination of the following or may be learned with the practice of the invention.

To achieve the foregoing and other advantages, and in accordance with one aspect of the present invention, an improved clock generation circuit is provided that operates with a single input clock frequency, and includes a digital Phase Locked Loop circuit (PLL) with a digital accumulator in the feedback loop in which either the Most Significant Bit or the Carry Bit of the binary adder of the accumulator circuit (which also is known as a numerical oscillator) is used as the modulated feedback clock to the phase/frequency detector of the PLL. In one embodiment, a register with a fixed add/phase amount is used to drive one of the inputs of the binary adder for output circuits that require a fixed output frequency. In addition, a pre-multiply or pre-divide circuit optionally can be provided at the input to either increase or decrease the frequency of the input clock signal before it reaches the phase/frequency detector of the PLL. The output frequency from the voltage controlled oscillator (VCO) also can be optionally divided to provide a lower output clock frequency, if desired. Moreover, the VCO's output frequency can be divided in the feedback loop before it is directed into the digital accumulator.

The granularity of the output clock frequency and the clock frequency drift are determined by the construction of the circuit. The digital accumulator includes an N-bit adder, and the adder's output is directed to the input of a set of D flip-flops. These flip-flops are clocked by the output of the VCO clock (or a divided down version of that clock), and the outputs of these D flip-flops are fed back into one of the inputs of the binary adder. A preloaded binary number is also fed into the other input of the adder circuit, and this preloaded number is determined by the desired frequency to be output from the circuit.

The output of the digital accumulator is fed as a modulated feedback clock to the phase/frequency detector of the PLL circuit. This modulated feedback clock preferably is the Most Significant Bit from the accumulator, or alternatively it could be the Carry Bit of the accumulator. In either case, both the MSB and the Carry Bit occur at the same frequency, and will have virtually the same effect on the phase/frequency detector. This will provide equal spacing per count sequence. Furthermore, any specific count decoded from the accumulator, such as comparison, equality, or inequality logic, will also result in the same frequency.

In the configuration where the add/phase register provides a constant number, the output frequency of the circuit will be a constant frequency. If it is desired to modulate the output frequency, then an Add Amount Modulator circuit can be provided that presents a varying numeric value to one of the inputs of the binary adder. This can be accomplished by communicating the MSB or Carry Bit to an address look-up table, which then outputs an address to a memory circuit, which in turn presents a different add amount to the binary adder. If a periodic modulation is desired, then the address look-up table will point to add amounts that create a particular periodic output frequency profile. This could include a Spread Spectrum profile.

The Add Amount Modulator can be synchronized with an external signal, such as the start signal of a laser scan (e.g., the HSYNC signal). In addition, the Add Amount Modulator can output a synchronization signal so that more than one clock generator can be daisy chained to operate in synchronization with one another.

The Add Amount Modulator can further include a Base Number register that can be added to the numeric values stored in the RAM or ROM memory circuit so as to keep the size of this memory circuit to a reasonably small value. In addition, a Start Number register can be provided in situations where the look-up table is in RAM, and will not be loaded with correct values until after an initialization procedure has been completed. In that situation, the Start Number register can provide values for the modulated add amount that is directed to the binary adder of the accumulator. This also can be used to increase the charge pump current of a programmable charge pump if it is desirable to speed up the process of locking the Phase Locked Loop circuit.

The Add Amount Modulator can be constructed in various configurations, and some of its optional registers can be eliminated under certain circumstances. In addition, the modulation of the frequency profile can be turned off if desired, in situations where certain circuit parameters are to be reset or changed in other ways. An example of this is to change the operating point of a laser printer.

One primary purpose of using the circuit of the present invention is to provide a single hardware design that can be used to generate virtually any frequency for either a constant frequency clock or a modulating frequency clock, all based upon an input clock signal that does not change. The use of optional frequency divide or frequency multiplier circuits allows great flexibility in the input frequencies versus output frequencies of the present invention's hardware design.

Still other advantages of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 1:
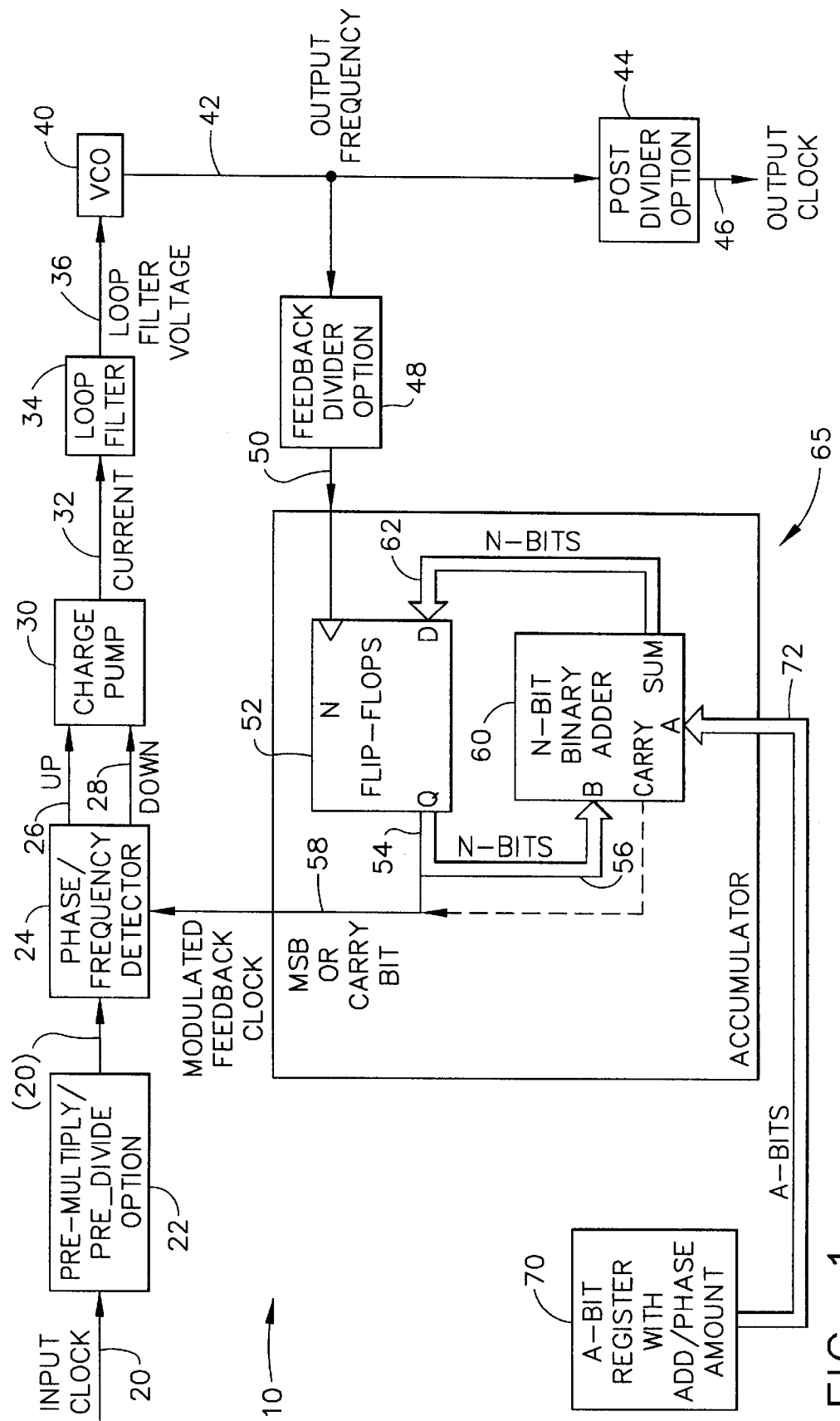
FIG. 1 is a block diagram showing the major components of a low drift clock generation circuit, as constructed according to the principles of the present invention.

Referring now to the drawings, FIG. 1 shows a clock generation circuit 10 that includes a Phase Locked Loop circuit with an accumulator in the feedback path that modulates the feedback clock signal. Such a frequency synthesizer circuit configuration is broadly known as a Direct Digital Synthesizer (DDS) or a Phase Locked Loop with a numerical oscillator in the feedback.

On FIG. 1, an input clock signal at reference numeral 20 is provided to the Phase Locked Loop ("PLL"), and this input signal preferably is a stable frequency clock such as that provided by a crystal clock oscillator. If this input clock frequency is either too large or too small at the input clock 20, then a frequency multiplier or divider optionally can be provided at 22. This will be referred to herein as a pre-multiply or a pre-divide option. The resulting frequency clock signal is provided to a phase/frequency detector circuit at 24. The input to the phase/frequency detector 24 can either be the input clock 20 directly, or it can be the output of the pre-multiply or pre-divide option circuit.

Phase/frequency detector 24 generates error pulses at 26 for UP, and at 28 for DOWN. These UP and DOWN signals are provided to a charge pump 30, that produces a positive current when an UP signal is received, and a negative current when a DOWN signal is received. As is well known in the art, an UP error pulse is generated when the feedback clock (at 58) lags behind the input clock (at 20), and the width of the UP error pulse is equal or proportional to the time difference between the rising edge of the input clock 20 and the feedback clock 58. In addition, a DOWN error pulse is similarly generated when the feedback pulse leads the input clock. The type of circuit that performs this function is the well known Motorola MC4044, which can be implemented in an ASIC.

It will be understood that, although it is preferred to use a digital phase/frequency detector as the frequency synthesizer circuit's "error detector," other types of error detectors could be substituted while remaining within the principles of the present invention. This could include analog or digital phase detectors, or analog or digital frequency detectors, which will be referred to hereinafter simply as "phase or frequency detectors."

The output current from the charge pump 30 (which could be either a current source or a voltage source) is depicted at 32 on FIG. 1, and this current flows into a loop filter 34. A typical topology of loop filter 34 is a capacitor that is in parallel with a series combination of a resistor and another capacitor. Of course, other loop filter topologies could easily be used while remaining within the principles of the present invention, such as when used with an error detector other than a phase/frequency detector. The output of loop filter 34 is a signal at 36, which is applied to a voltage controlled oscillator (VCO) 40, which produces a high frequency clock output signal at 42.

The output frequency at 42 from VCO 40 is optionally provided to a divider circuit referred to herein as a "post divider option" at 44, which will be used if the output frequency 42 produced by VCO 40 is much larger than desired for the output clock at 46. If the post divider option 44 is used, the final output clock signal is depicted at reference numeral 46 on FIG. 1. Naturally, if no post divider optional circuit was required, then the output frequency at 42 from VCO 40 would directly become the output clock signal of the entire circuit. The output provided by the VCO 40 is a digital output, which is a single bit in width. This digital output will make transitions at the output frequency desired. If the post-divider option is used at 44, then the output clock signal at 46 will be some division of this output frequency, but this signal also is a digital signal.

Another frequency divider circuit is optionally provided at 48 in the feedback loop of the circuit 10 of FIG. 1. This is referred to herein as the "feedback divider option" or feedback divider circuit at reference numeral 48. Its output at 50 is directed into an accumulator 65. This feedback divider option 48 may be used to divide down the output frequency 42 of the VCO 40 to a frequency low enough for the accumulator to properly operate. Otherwise, no feedback divider option circuit at 48 would be required, and the clock signal at 42 produced by the VCO 40 would be directly connected into the accumulator 65.

Accumulator 65 includes a binary adder stage and a latching stage, which overall comprises a digital accumulator. In some physical applications, it may be possible to eliminate the latching stage, or to incorporate logic elements other than flip-flops. The digital accumulator can be as many bits wide as the desired precision for frequency resolution of the frequency synthesizer 10, and on FIG. 1 this is referred to as "N" bits. The latching stage will thereby comprise N flip-flops at 52, and the feedback signal at 50 is connected into the clock input of these N flip-flops. The binary adder stage is depicted at the reference numeral 60, and this would be an N-bit binary adder.

The output of the binary adder 60 is depicted at the notation "SUM" and this output comprises a set of parallel signals that are fed via a bus that is N bits wide at 62 into the D input of the N flip-flops at 52. The outputs of these D flip-flops has the notation Q, and these outputs are fed to an N-bit bus at 54. The same N output signals are fed along an N-bit bus at 56 into the "B" input of the binary adder circuit 60. Preferably, either the Most Significant Bit (MSB), or the Carry Bit is directed along a signal line 58, which becomes a modulated feedback clock that is directed into the other input of the phase/frequency detector 24. Alternatively, as stated above, other types of specific count decoding schemes could be used in lieu of the MSB or Carry Bit, without departing from the principles of the present invention (such as comparison, equality, or inequality logic acting to decode the count value), and will also result in the same frequency.

A preloaded binary number is fed into the other input of the binary adder 60, at its "A" input. This preloaded number is temporarily stored in an A-bit register at reference numeral 70, and the output of this register is directed along an A-bit bus at 72. Register 70 will contain an add/phase numeric quantity, and also is capable of containing an initialization value for the. Phase Locked Loop/accumulator circuit. This preloaded number is determined by the desired output frequency of the output clock at 46, and is loaded upon initialization into the A-bit register 70. It should be noted that "A" must be less than or equal to "N."

To determine the value that is to be preloaded from the register 70, the desired output frequency ($freq_{out}$) must be determined, the input clock frequency ($freq_{in}$) that is fed into the input of the phase/frequency detector 24 must be known, and the size in bits (N) of the accumulator must be known. Once all these quantities are known, the following equation can be used to calculate the add amount:

$$\text{Add amount}=2^N*(freq_{in}/freq_{out})$$

This number is then rounded to the nearest integer.

The size of the accumulator is determined by the required accuracy of the output frequency. The greater the required accuracy, the larger in bits the accumulator must be. To determine the size of the binary added stage 60, one must know the desired maximum frequency ($freq_{max}$), the clock frequency that is fed into the phase/frequency detector 24 ($freq_{in}$), and the desired accuracy. To accurately determine N, an iterative approach is suggested, as follows: first, one chooses a temporary value of N; then an add amount is determined by the following expression:

$$\text{Add amount}=2^N*(freq_{in}/freq_{max})$$

The add amount is rounded down and rounded up to the nearest integers. For example, if the add amount was determined to have the value 786.432, the lower integer would be 786 and the upper integer would be 787. These two add amounts are used to calculate the expected output frequencies if they were to be used. The expected output frequency is calculated by the following expression:

$$\text{Frequency}=freq_{in}*(2^N/(\text{Add amount}))$$

Continuing the iterative methodology, one would then look at the two frequencies generated by the above equation and determine if the frequencies produced were accurate enough. If the frequency granularity is not accurate enough, N is increased by 1, and the process is repeated.

The amount of allowable frequency drift dictates the closed loop analog bandwidth of the Phase Locked Loop/accumulator circuit of the clock generation circuit 10. The smaller the allowable frequency drift, the lower the bandwidth must be. Loop parameters would be varied until the drift was at an acceptable level.

As related above, a post divider circuit may be added as an enhancement to the PLL/accumulator circuit of FIG. 1. This post divider option 44 would allow for an output frequency range to be below the operational range of the VCO 40. Another enhancement could be to provide a pre-multiplier circuit at 22, in which a higher input frequency to the phase/frequency detector 24 will reduce the required size of the accumulator 65. This multiply function could be performed by an additional Phase Locked Loop. Another enhancement could be to provide a pre-divider circuit at 22.

A further enhancement would be the use of a feedback divider circuit that could be optionally provided, as depicted at 48. This feedback divider optional circuit could be used to reduce the VCO output frequency if it was too great to be processed by the accumulator 65. Another enhancement could be a programmable charge pump, which would allow the user to change the analog bandwidth of the PLL/accumulator circuit. Further circuitry could be added to the programmable charge pump to temporarily increase the charge pump current until the Phase Locked Loop is locked upon initialization of the PLL/accumulator circuit.

Yet a further enhancement could be the use of two different input frequency sources that can be made selectable. The two frequency sources could be off from one another by half the frequency accuracy of the accumulator, which would make the PLL/accumulator of the clock generation circuit more accurate. In general, the accumulator size depends upon the clock rate and how fast it is desired by the designer for the accumulator to rollover.

One exemplary example of a circuit operation using the principles of the present invention is as follows: the input frequency is set to 48.000 MHz, and the output frequency range of the circuit would be from 125 MHz–250 MHz. The pre-multiply/pre-divide function is set to 1. The analog bandwidth of the Phase Locked Loop/accumulator circuit would be 1542 Hz. In addition, the feedback divider and post divider are set to 1. The accumulator size is 12-bits.

In this example configuration, the maximum delta between selectable frequency steps would be 0.1272 MHz. Spice simulations predict the frequency drift to be only three parts per million once the PLL/accumulator circuit is running in steady state. For additional frequency accuracy, a second input clock source could be set to 48.0305 MHz. The ranges of the programmable charge pump could be 1%, 10%, and 100% of the desired charge pump current. Another optional feature would be to use a charge pump that acts as a voltage source instead of a current source.

A programmable charge pump could be utilized in the circuit of FIG. 1 as noted above, and this would allow the bandwidth of the PLL to be changed during active circuit operation. This could be implemented by use of a register in the charge pump 30 that could be loaded by a microprocessor or by a Logic State Machine, all of which could be included in a single ASIC (Application Specification Integrated Circuit), if desired. By use of a programmable charge pump, a single hardware circuit could be constructed according to the circuit of FIG. 1, and this single circuit could be used in many more than one specific application.

An alternative to a register that can be loaded with a binary number would be a charge pump that has a Select input, and depending upon the state of the Select input, the output current magnitude would be determined. One obvious purpose of using a Select input would be to provide larger charge pump currents upon initialization, which would cause a greater bandwidth, and would result in a faster lock time for the PLL (but also more ripple). Once approaching the correct operating frequency, the Select input of the charge pump would be flipped so the circuit would begin to provide normal charge pump currents, and then exhibit normal bandwidth and ripple characteristics. Naturally, a programmable charge pump would allow similar operation upon initialization to create a faster lock time of the PLL.

Figure 2:
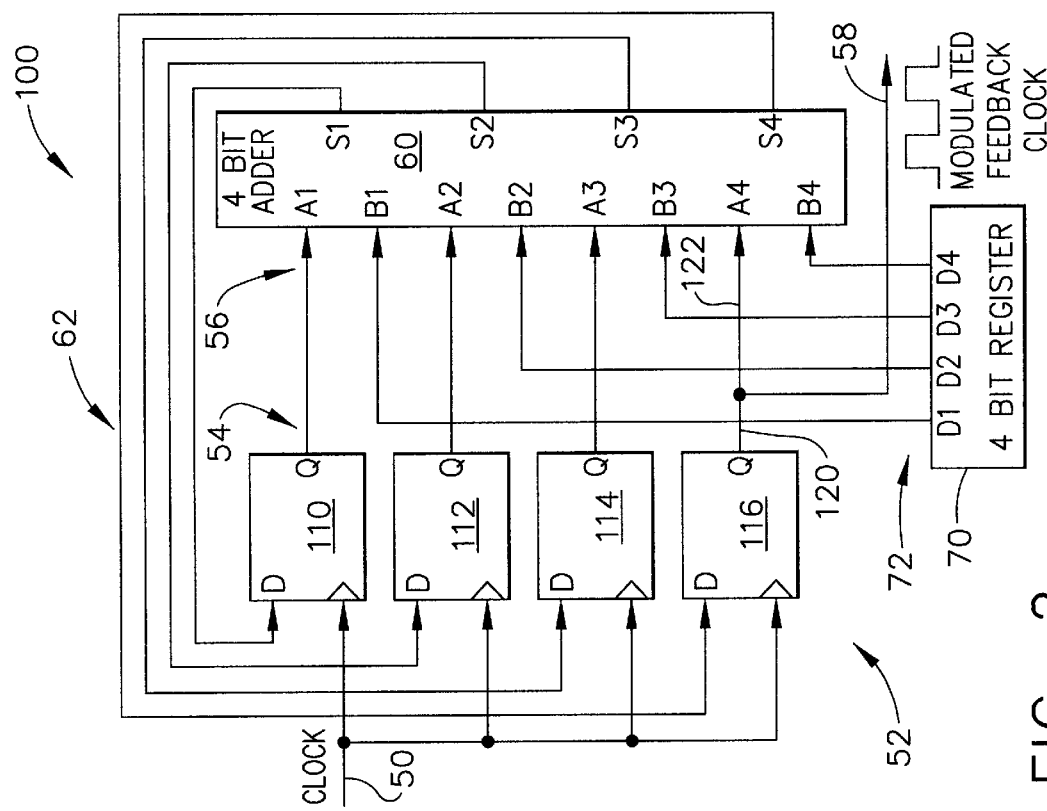
FIG. 2 is a schematic diagram of the digital accumulator of FIG. 1, in which the modulated feedback clock output signal is derived from the Most Significant Bit.

A more detailed circuit diagram for the accumulator 65 and the A-bit register 70 is provided in FIG. 2. In FIG. 2, this portion of the clock generation circuit 10 is designated by the reference numeral 100, which contains the binary adder 60, set of D flip-flops 52, and register 70. In the example of FIG. 2, the value of N is four (4).

The clock input for this circuit portion 100 is designated as 50, which represents the output of the feedback divider option 48 on FIG. 1. As can be seen in FIG. 2, this clock is directed into the clock input of each of the flip-flops, which are individually designated as 110, 112, 114, and 116. The clock input to the flip-flops 52 causes each of the D flip-flops to update their output when the input clock signal at 50 makes a transition to Logic 1. The Q output of these flip-flops is represented by the four signal lines as representing the bus 54 on FIG. 1. The most significant bit is the Q output at 120, which is directed not only to the adder circuit 60 along a signal line 122, but also is output along the signal line 58 as the modulated feedback clock signal, having a waveform that has a duty cycle of 50%.

The bus 56 on FIG. 1 is illustrated on FIG. 2 by the four signal lines that are output from the Q outputs of the flip-flops 52 (as a group). These output lines are connected into the "A" inputs of the four-bit adder 60. This includes the Most Significant Bit output, which is connected to the "A4" output along a signal line 122.

A four-bit register 70 is used to provide the add/phase amount along four individual signal lines that collectively make up the four-bit bus 72. These four signal lines are connected to the "B" inputs of the four-bit adder 60.

The SUM outputs "S1," "S2," "S3," and "S4" are connected along a four-bit bus 62 into the D inputs of the four flip-flops 110, 112, 114, and 116, respectively.

In an example use of this circuit 100, if the four-bit register 70 provides a value of five (5) into the "B" inputs of the adder 60, and if the Q outputs of the D flip-flops are presently all at Logic 0, then the output value of the adder circuit 60 will be the value five (5). Upon the next clock transition, the D flip-flops 52 will collectively be set to the value of five (5). This means that the Q output of flip-flop 110 will be set to Logic 1, and the Q output of flip-flop 114 will also be set to Logic 1. The Q outputs of flip-flops 112 and 116 will remain at Logic 0.

If the numeric value remains at five (5) for the outputs of the four-bit register 70, then the SUM outputs of adder 60 will now become equal to the value of ten (10). Upon the next clock edge, the outputs of the D flip-flops 52 will collectively be set to a value of ten (10). If the numeric value remains equal to five (5) at the four-bit register 70, then the SUM outputs of adder 60 will now contain a value of fifteen (15). Upon the next clock transition, the outputs of the D flip-flops 52 will collectively be set to the value of fifteen (15).

Assuming the numeric value of the register 70 remains at five (5), the SUM outputs of the adder 60 would now attempt to be equal to twenty (20), however, since this is a four-bit adder, the count value for its SUM outputs must rollover such that the Carry Bit (if there was one in this example) would be set, and the numeric value of the SUM outputs becomes equal to four (4).

Assuming the four-bit register 70 continues to output a value of five (5), then upon the next clock transition the D flip-flops 52 will collectively output a value of four (4), and the SUM outputs of the adder 60 will now have a value of nine (9).

This detailed example is provided to demonstrate one operational aspect of the present invention. The Most Significant Bit (MSB) is found at the output of flip-flop 116 along the signal line 120. When the flip-flops first outputted a value of five (5), this MSB value remained at Logic 0. Upon the next clock transition, the collective outputs of the flip-flops 52 became equal to ten (10), and the MSB became set to Logic 1. Upon the next clock edge, the collective outputs of the flip-flops 52 became equal to fifteen (15), and the MSB remained at Logic 1. Upon the next clock transition, the collective outputs of the flip-flops 52 had a value of four (4), and the MSB was reset back to Logic 0. It thus can be seen that the MSB will act as a square wave signal source at the desired frequency that is output from the accumulator circuit 65. Its waveform will approximate a 50% duty cycle, as depicted on FIG. 2.

The use of the digital accumulator in the present invention allows for odd numbers that may provide different frequencies using the same precise hardware circuit. It should be noted that the Most Significant Bit pulses can occur either every N or every N+1 count. Since the loop filter 34 is effectively averaging the frequency being output by VCO 40, the loop filter needs to have a low enough bandwidth to average over a sufficient number of accumulator periods to catch the true repetitive period. This true repetitive period could be as great as $2^N$ accumulator periods (e.g., if counting by one (1), or if the remainder only increases by one (1) after each rollover).

When designing the precise circuit capabilities, if it is assumed that the value for N is predetermined, then this will determine the phase/add amount, and also will then determine the bandwidth of the PLL. It would be then preferred to construct a prototype to test the robustness of the circuit, then begin minimizing the bandwidth iteratively until an unacceptable ripple occurs, or until the circuit begins to exhibit other problems (such as crowding against the performance envelope of either the VCO or the accumulator).

Figure 3:
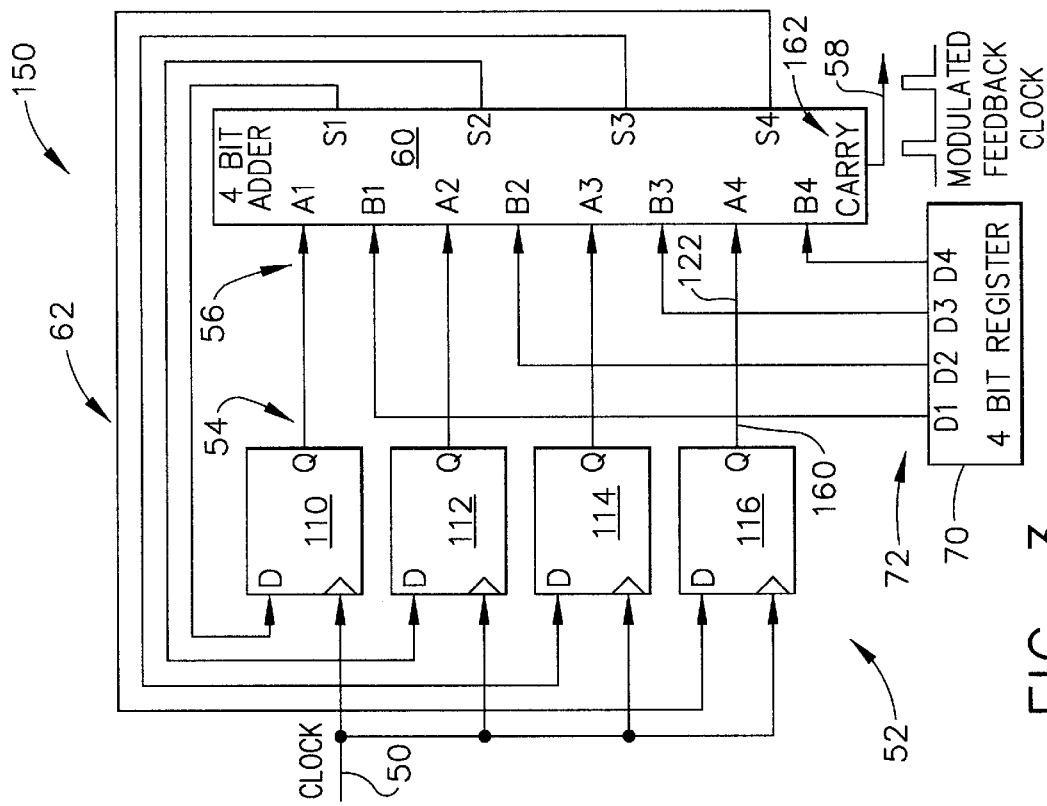
FIG. 3 is a schematic diagram of the digital accumulator of FIG. 1, in which the modulated feedback clock output signal is derived from the Carry Bit.

FIG. 3 illustrates a circuit generally designated by the reference numeral 150, which utilizes the same basic components as depicted on FIG. 2. There is still an input clock at 50, four (4) D flip-flops 110, 112, 114, and 116, collectively designated by the reference numeral 52, a four-bit adder 60, and a four-bit register 70. The output signals from the fourbit register 70 are run through a bus 72 to the "B" inputs of the adder circuit 60. The SUM outputs of the adder 60 are run along a bus 62 into the D inputs of the flip-flops 52. The Q outputs of the flip-flops 52 are run along a bus 54 that is four bits wide, and this also becomes the bus 56 that provides the input signals to the "A" inputs of the adder circuit 60. The Most Significant Bit (MSB) output from the flip-flop 116 is located at the reference numeral 160 which, however, does not split off in this case to become the modulated feedback clock signal. Instead, the Carry output at 162 of the adder 60 is used to provide the modulated feedback clock at 58.

If the previous example numeric values are used in the circuit of FIG. 3, then the Carry output will remain at a Logic 0 value until the adder output value rolls over past the value fifteen (15). Upon the next clock transition after this occurs, the Carry output will be set to a Logic 1 value for a short time interval. This provides a waveform as depicted on FIG. 3, however, this waveform typically will have a fairly small duty cycle. For that reason, in most instances it is preferred to use the MSB signal from the collective flip-flops as the modulated feedback clock 58. On most digital accumulator circuits, the Carry Bit changes at rollover, and is only a single clock width in pulse duration. Naturally, a pulse-width stretching circuit could be used on the output of the Carry Bit to increase the ON-time, if desired. Another way to stretch the pulse-width duration of the Carry Bit would be to provide an additional flip-flop downstream from the Carry output at 162, which would act as a latch for the Carry Bit. In this situation, there would be N+1 flip-flops in the accumulator circuit of FIG. 3.

While use of the Most Significant Bit is preferred since the pulse width has longer duration than the raw Carry Bit pulse, it should be noted that both signals will occur at the same frequency. The main purpose of the adder in this accumulator circuit is to provide equal spacing per count sequence. While the Most Significant Bit and Carry Bit are easily obtainable signals in a digital accumulator, the principles of the present invention would also work with any type of digital magnitude compare circuit. For example, a zero detect circuit, or a comparison circuit that will detect a condition either greater than or less than any particular numeric output result from the adder could be used as an indication that a full sequence has occurred since the previous comparison result was true. For example, in a four-bit adder, one could detect when the result was equal to seven (7) by inspecting the first three Lowest Significant Bits, and then perform a comparison based upon that particular numeric value. It would probably not be best to provide an "equivalent" logic circuit that detects when a particular numeric value is equal to the output of the adder, and it would be better design to perform a comparison detecting a condition either greater than or less than that numeric value. For example, if the four-bit register 70 was always adding an even number, and thus the four-bit adder's output at its SUM output signals was always an even number, then it certainly would not work to try to detect when the numeric result of the outputs was equal to seven (7). Instead, the designer would want to compare whether or not the numeric output was greater than seven, for example.

Figure 4:
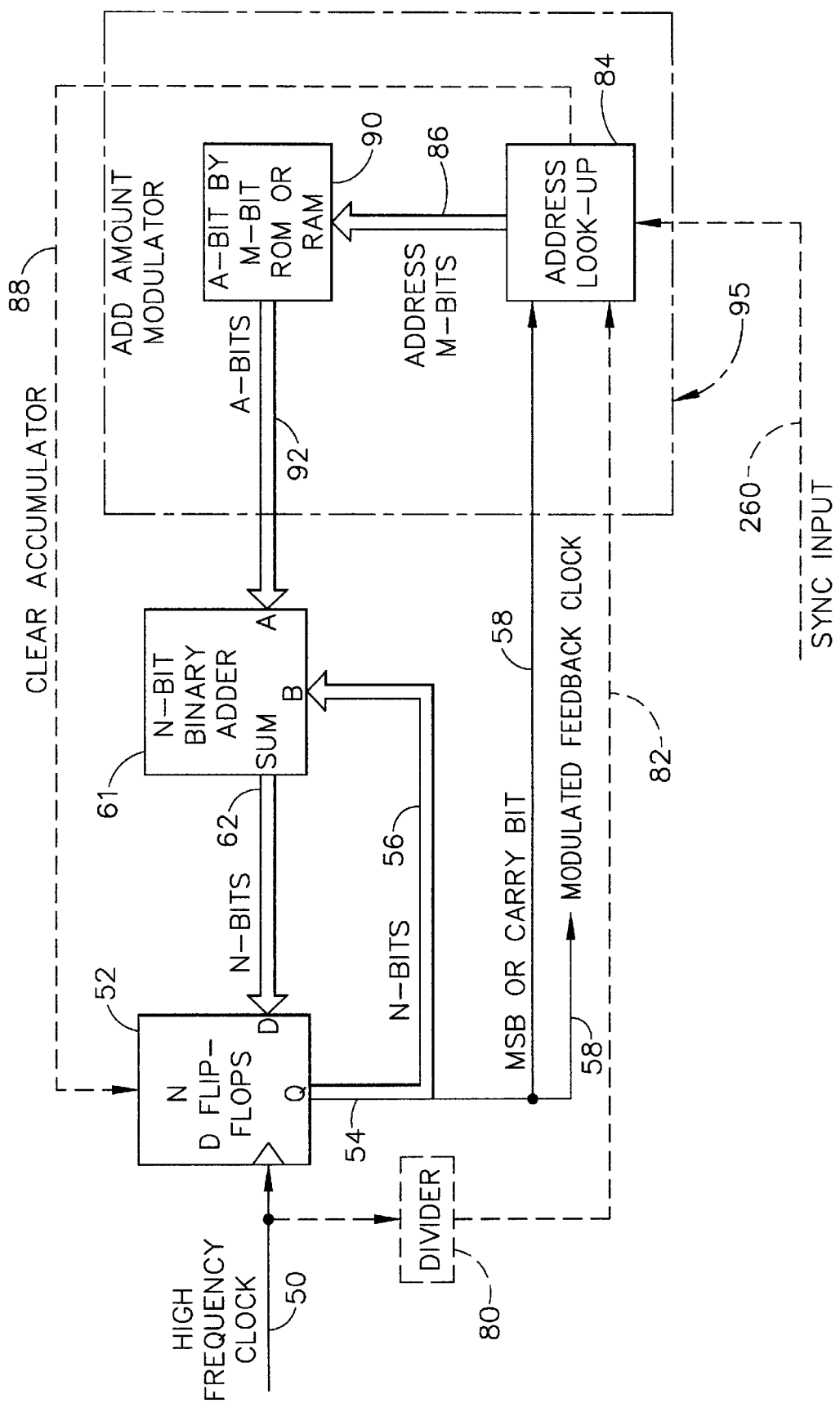
FIG. 4 is a block diagram of an enhanced portion of the circuit used in the clock generation circuit of FIG. 1, in which an "Add Amount Modulator" is used as an input to the digital accumulator of FIG. 1.

FIG. 4 illustrates a variation in the accumulator circuitry, by use of an "Add Amount Modulator" that is generally designated by the reference numeral 95. Add Amount Modulator 95 is different from the A-bit register 70 of FIG. 1, in that it can change the add amount over time, thereby making the clock generation circuit into a time-frequency varying device that can act as a spread spectrum clock generator. When the add/phase amount is always constant, the output frequency of the output clock 46 on FIG. 1 will always be virtually or substantially constant. However, if the add/phase amount can vary over time, then the output frequency will also vary over time.

In FIG. 4, the accumulator circuit is depicted as still containing N flip-flops at 52, in which these D-type flip-flops have a clock input that receives a high frequency clock signal 50 (which is the same as the signal 50 on FIG. 1 that is output by the optional feedback divider circuit 48). The Q outputs of the N flip-flops 52 are carried over an N-bit bus 54, and the same N bits are carried through a continuing bus 56 to the "B" input of an N-bit binary adder 61. The "A" input of binary adder 61 comes from an A-bit bus 92 that carries signals output by the Add Amount Modulator 95. The binary adder 61 also contains a SUM set of outputs that are carried by an N-bit bus 62 to the "D" inputs of the D flip-flops 52. (As noted above, A must be less than or equal to N in this scheme.)

The difference between the "N" D flip-flops 52 of FIG. 4 and the "N" flip-flops 52 of FIG. 1 is that the "N" D flip-flops 52 of FIG. 4 also contain a "clear" input that will make it possible to reset the output values of the Q outputs of the "N" D flip-flops 52 (of FIG. 4). This is designated on FIG. 4 as a "Clear Accumulator" signal at 88, which also is output from the Add Amount Modulator 95.

The Q outputs from the flip-flops 52 also contain a Most Significant Bit, and this MSB (or the Carry Bit) will be used as a modulated feedback clock at 58. This modulated signal 58 is also directed to some combinational logic that acts as an address look-up table, designated by the reference numeral 84. This address look-up table 84 can generate a new address for each rising edge or falling edge transition of the MSB or Carry Bit. This address preferably is directed into a ROM or a RAM memory circuit, designated by the reference numeral 90. The address signal is M bits in width, and travels along a bus 86 M bits wide between the address look-up table 84 and the ROM or RAM circuit 90. The ROM or RAM memory circuit itself will then be preferably A-bits by M-bits in size, in which the output from the ROM or RAM circuit 90 will present a new add amount into the input "A" of the N-bit binary adder 61. The new add amount is A bits wide, and travels along a bus 92 that is Abits in width.

It will be understood that memory circuit 90 could comprise types of logic devices other than classical RAM or ROM, without departing from the principles of the present invention. For example, ROM-type numeric information could be compiled into combinations of logic functions and/or devices, and implemented in devices such as gate arrays, ASIC's, PLA's, and other similar electronic or optoelectronic devices, including programmable hardware devices.

The add amounts are predetermined to produce a particular desired modulation. If it is desired for the output clock to be modulated with a periodic waveform, then the Add Amount Modulator 95 will provide the appropriate add amounts over the bus 92 to create that periodic waveform, which could produce a clock with spread spectrum clock characteristics. In this configuration, the address look-up table 84 will change the add amount in synchronization with the rollover of the binary adder 61, which will of course not necessarily occur at a fixed rate since the add amount can be continually changed by the Add Amount Modulator 95.

The PLL loop filter bandwidth also affects the modulation observed at the output clock signal 58. The parameters of the loop (i.e., the charge pump current, VCO gain, and loop filter elements) could be changed to achieve the desired loop filter bandwidth. As noted above, the loop filter needs to have a low enough bandwidth to average over a sufficient number of accumulator periods to catch the true repetitive period. However, if a periodic waveform is to be generated, such as in the case of a Spread Spectrum Clock Generator, then the loop filter bandwidth should not be so low as to encompass the entire set of intervals that make up the entire period of the spread spectrum profile, else the output frequency would never significantly change.

Another feature of the accumulator circuit of FIG. 4 is the Clear Accumulator signal at 88 that can be used to set the phase remainder amount in the accumulator to a predetermined amount. Typically, this signal 88 would be used to set the accumulator to zero (0) after the MSB has returned to zero (0) when the modulation needs to be synchronized to an external signal.

Yet another feature of the accumulator circuit of FIG. 4 is an additional frequency divider at reference numeral 80 that can optionally be provided to change the add amount at a different rate. The output of divider 80 is presented to the address Look-up table 84 along a signal line 82. This will generate a new address for each rising edge or falling edge transition of the output of divider 80, and this address is again fed into a RAM or ROM circuit 90 that presents a new add amount to the input A of the binary adder 61. As stated above, the add amount would thereby be changeable at a different rate, although this periodic rate would be a fixed rate of change.

Figure 5:
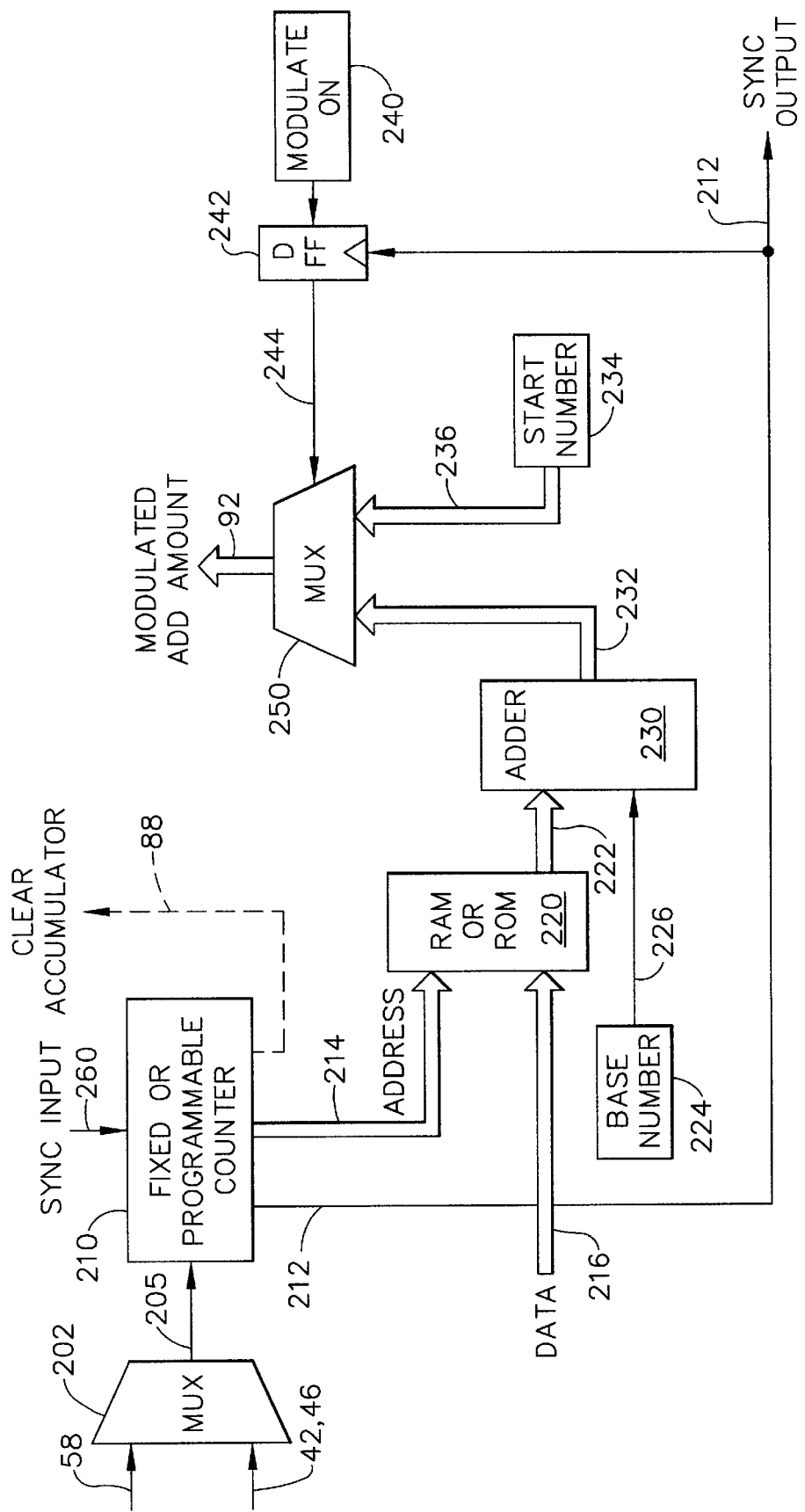
FIG. 5 is a block diagram of the Add Amount Modulator of FIG. 4.

FIG. 5 is a block diagram 200 of a more detailed depiction of the Add Amount Modulator 95 of FIG. 4. Starting with the modulated feedback clock signal 58, this signal is directed into a multiplexer 202 (or some other type of "Select" circuit) that will output one of the signals that is presented to the multiplexer as an input. The other input to multiplexer 202 depicted on FIG. 5 is one of the output clock signals, such as the raw output frequency 42 from VCO 40, or its divided output frequency signal 46 that represents the output clock in situations where a post-divider is optionally provided.

The output of multiplexer 202 is presented along a signal line 205 to a counter 210 that is either fixed, or alternatively could be programmable. The input signal along line 205 should have a frequency that is significantly greater than the modulation frequency used, for example, as a Spread Spectrum Clock. The counter 210 creates an address for a memory device, which may be a RAM, ROM, or any other storage device. On FIG. 5, this memory device is depicted at the reference numeral 200, and the address information is fed from the counter 210 along a bus 214 into the RAM or ROM, or other type of memory circuit, 220. The output from the RAM or ROM 220 represents a new add amount that will be used in the N-bit binary adder 61 of FIG. 4.

If the numbers that need to be stored are large in magnitude and the amount that the numbers shall vary are small in magnitude, then a base number can be added to the stored values to keep the memory size small. This is accomplished by a Base Number register 224 which provides a numeric value along a signal line 226 into an adder circuit 230. The output from the RAM or ROM memory circuit 220 is presented along a bus 222, also to the adder circuit 230. The output of the adder circuit 230 is presented along a bus 232 into another multiplexer 250. It will be understood that this adder 230 will not be necessary if no Base Number is required to keep the size of the memory device 220 within a reasonable constraint.

If the address look-up table 220 comprises RAM, and therefore, the circuit will initially start with blank numbers, then a "Start Number" register 234 will preferably be included to provide a realistic number for control upon initialization. Start Number register 234 provides a numeric value along a bus 236 also to multiplexer 250. Upon initialization, multiplexer 250 would preferably output values that are presented from the Start Number register 234 at its outputs along a bus 92. This bus 92 is directed to the "A" inputs of the binary adder 61 on FIG. 4.

A "Modulate ON" register 240 can be provided (either as a register or as an input from some external signal) and is used to select between the fixed or modulated adder amount. This Modulate ON signal/register 240 is presented to a D flip-flop 242, which has an output 244 that selects the desired input that multiplexer 250 will essentially pay attention to at any particular time. This portion of the circuit 200 could be used to start a Spread Spectrum Clock Generator feature when the counter 210 reaches zero (0), which would be indicated by an output 212 from the counter 210. This output 212 is used as the clock input to the D flip-flop 242.

If the address look-up table 220 comprises ROM, there will always be correct real numbers to work with, and the Start Number register 234 will not be required. In that situation, the multiplexer 250 also would not be required.

An additional feature of the circuit 200 is a "Sync Input" signal at 260 that resets the programmable counter address to the starting address in the memory device 220. This can be used to synchronize the modulation to some external signal. A "Sync Output" signal can also be provided at 212, which can be used to synchronize this stage (e.g., a Spread Spectrum Clock Generator) with some other clock circuit, including a second Spread Spectrum Clock Generator. In this situation, the Sync Output signal 212 can be used to daisy chain more than one Spread Spectrum Clock Generator, and would connect to the Sync Input of the next clock circuit. One typical application for this configuration is to run two Spread Spectrum Clock Generators at different frequencies, however, these different clocks are always to synchronize the modulation frequency. This could be used to synchronize video signals, for example.

Another use for the Sync Input 260 is to synchronize a laser printhead of a laser printer to the start of a scan line. The Sync Input 260 could additionally be used to point to a particular address in the RAM or ROM memory circuit 220 at a particular time, although it would not necessarily have to point to the starting address.

Another feature of the circuit 200 in FIG. 5 is a "Clear Accumulator" signal at 88 that is output from the counter 210. This is the same signal as depicted on FIG. 4 that can be used to set the phase remainder amount in the accumulator to a predetermined number. As noted above, typically this would be used to set the accumulator to zero (0) after the MSB has returned to zero (0), when the modulation needs to be synchronized to an external signal. Consequently, the Clear Accumulator signal 88 can be slaved to the Sync Input signal 260, if desired. In particular physical applications, such as synchronizing a laser printhead to the start of a scan line, the Sync Input signal 260 will likely occur at a time where there is a remainder within the accumulator circuit, and so it may be very desirable to have the capability of clearing that accumulator. This could typically occur when the MSB turns off upon rollover of the accumulator.

It would also be possible to synchronize the operations of the Sync Input 260 and the clearing of an accumulator remainder by slaving the Sync Input transition with a Clear Accumulator output signal at 88, and this could also be used to simultaneously reset a programmable counter address in the memory circuit 220.

The Modulate ON input at 240 can be turned OFF for various reasons during circuit operation. One such reason would be to change the operating point of a laser printhead.

Finally, a separate Data input can be provided at 216 to the memory circuit 220. This would be useful in situations where the memory circuit 220 comprises RAM, and this data input 216 would be used to load the look-up table that resides in this particular RAM In essence, the data pathway 216 would comprise a portion of the microprocessor's data bus where the microprocessor, for example, controls the print engine of a laser printer. Of course, physical devices other than laser printers could also use this feature.

Figure 6:
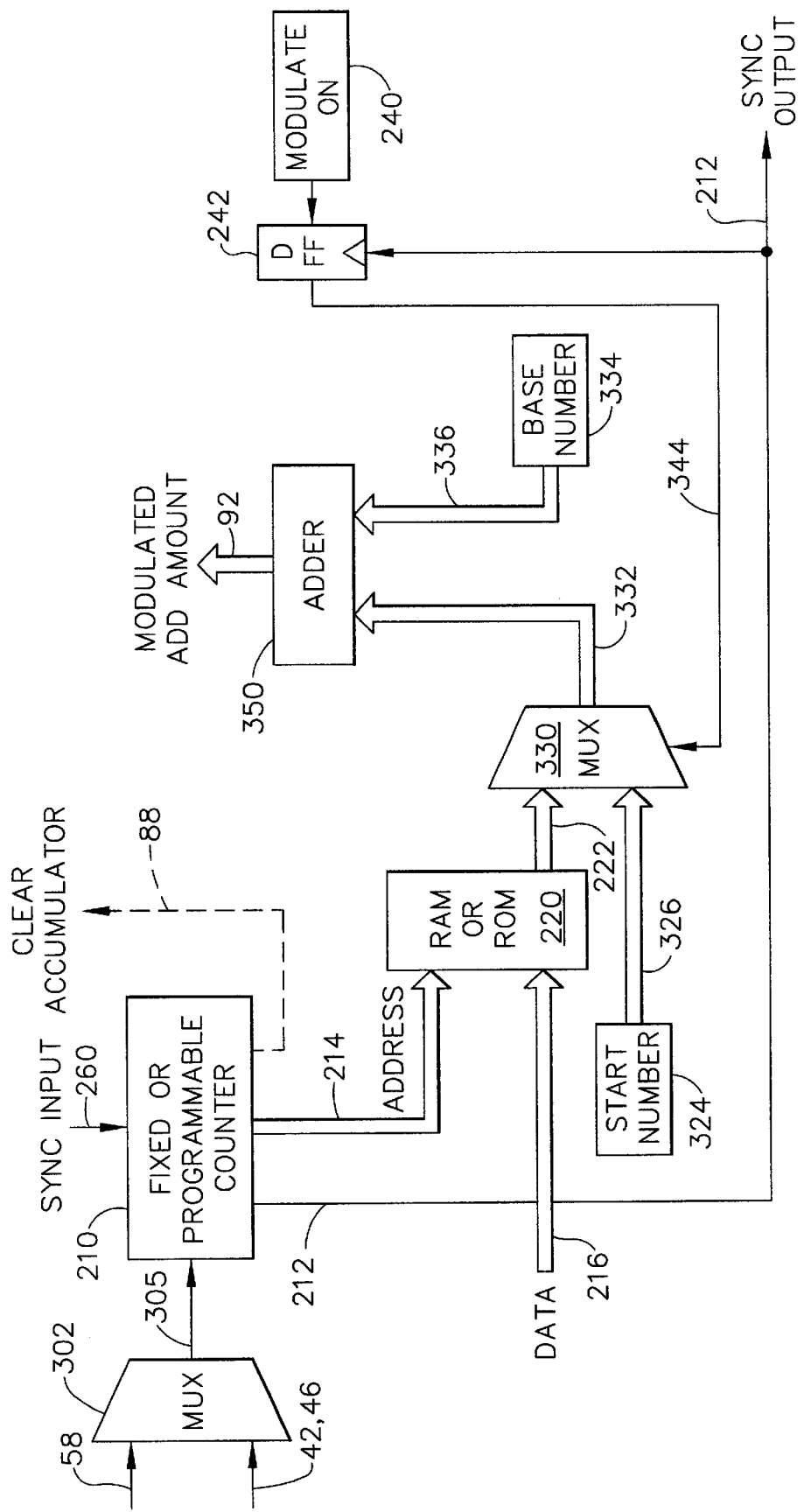
FIG. 6 is a block diagram of an alternative embodiment for the Add Amount Modulator of FIG. 4.

FIG. 6 represents a modified Add Amount Modulator 95, in which the circuit diagram is given the general designation 300. A multiplexer 302 receives the input signals, such as the MSB or Carry Bit at 58, or some other clock signal such as the output frequency 42 from the VCO 40 of FIG. 1, or a divided output frequency that is used as the output clock signal at 46. The output of multiplexer 302 is presented to the fixed or programmable counter 210 along a data line 305.

Many of the components of the circuit 300 in FIG. 6 are identical to those depicted in circuit 200 of FIG. 5. The similar components include the counter 210, RAM or ROM memory circuit 220, a Sync Input signal 260, a Sync Output signal 212, and a Clear Accumulator output signal 88. In addition, a Modulate ON signal (or input) 240 drives into a D flip-flop 242, using circuit components that are identical to those on FIG. 5.

The main difference between FIGS. 5 and 6 is that the multiplexer and adder circuits have been juxtapositioned. The memory circuit 220 provides an output along a bus 222 into a multiplexer 330 (rather than an adder circuit 230 as in FIG. 5). A Start Number register 324 provides a numeric signal along a bus 326 into the multiplexer 330. The output of the multiplexer 330 travels along a bus 332 into an adder circuit 350.

A Base Number register 334 is provided and outputs a numeric signal along a bus 336 into the adder 350. The D flip-flop 242 also provides a signal to the multiplexer 330 along a pathway 344. The output of the adder circuit is the Modulated Add Amount, along a bus 92 that is directed into the "A" input of the binary adder 61 on FIG. 4.

As in the case of the circuit 200 on FIG. 5, the adder 350 will not be required if no Base Number is needed to keep the memory size to a reasonably small size. In addition, if a Start Number register is not needed, then the multiplexer 330 will also not be required. This would most likely occur if the memory circuit 220 consisted of ROM, rather than RAM.

The Data input along a bus 216 is also optionally available in situations where the memory circuit 220 comprises RAM, and needs to be loaded with look-up table values after initialization.

All of the other optional features discussed in reference to FIG. 5 hereinabove will virtually apply identically to FIG. 6. In both cases, the add amount can be modulated in a periodic manner so as to cause the clock generation circuit of FIG. 1 to act as a Spread Spectrum Clock Generator. Moreover, the Sync Input and Sync Output 212 can be provided to daisy chain more than one Spread Spectrum Clock Generator circuit, and also to synchronize the performance of the Add Amount Modulator 300 with some external signal, such as the start of a scan for a laser printhead of a laser printer.

It will be understood that other arrangements of similar electronic components could be used to advantage while nevertheless falling within the principles of the present invention. Moreover, a purely digital circuit could be implemented entirely within an ASIC, if desired, and various optional components could be built into such an ASIC. At the end of the product is design procedure, these optional components either could be "wired around" to delete any particular option merely by a programming change to the ASIC, or certain option—such as frequency dividers or frequency multipliers—could have their ratios set to 1:1 by a programming change to the ASIC, to effectively eliminate their effects on the overall circuit.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A clock generating circuit, comprising:
   (a) a frequency synthesizer circuit having: (i) an error detector, (ii)an oscillator output circuit, and (iii) a feedback loop that includes an adder circuit;
   (b) said frequency synthesizer circuit receiving: (i) an input clock signal of a substantially constant frequency, which is in communication with said error detector, and (ii) an add/phase quantity which is in communication with said adder circuit, wherein said add/phase quantity is varied in a periodic manner, thereby causing an output frequency to change in a periodic manner;
   (c) said adder circuit having a single bit output that is in communication with said error detector, said output acting as a modulated feedback clock signal, wherein said modulated feedback clock signal comprises a pulse signal that is generated at substantially equal time intervals per count sequence of said adder circuit and that is derived from one of (i) a Carry bit, or (ii) a most Significant Bit of said adder circuit;

(d) at least one latch circuit that temporarily holds an output valve of said adder circuit, and thereby creates said modified feedback clock signal; and wherein said frequency synthesizer circuit generates a substantially accurate output frequency under control of said add/phase quantity, and wherein said add/phase quantity is generated by an Add Amount Modulator circuit, which comprises: (i) an address look-up table, and (ii) a memory circuit that stores various add amount numeric quantities; wherein said memory circuit provides a varying numeric quantity to said adder circuit over time.

2. The clock generating circuit as recited in claim 1, wherein said Add Amount Modulator circuit further comprises at least one of: (i) a Base number register and a second adder circuit; (ii) a Start number register and a multiplexer; (iii) a Modulate ON input and a latching circuit; or (iv) a data input to said memory circuit in which said memory circuit comprises RAM.

3. The clock generating circuit as recited in claim 2, further comprising at least one of: (i) a Sync Input signal that resets an address in said address look-up table to a predetermined address; (ii) a Sync Output signal that synchronizes an external clock circuit to said frequency synthesizer circuit; or (iii) a Clear Accumulator signal that sets a phase remainder amount in said adder circuit to a predetermined numeric value.

4. A method for controlling a spread spectrum clock generator circuit, said method comprising:

(a) providing an input clock signal to a frequency synthesizer circuit, and providing a controller, said frequency synthesizer circuit having an adder circuit in its feedback loop; said frequency synthesizer circuit under control of said controller generating a plurality of output frequencies over time using a predetermined spread spectrum profile;

(b) generating a signal pulse for each count sequence of said adder circuit, and using said signal pulse as a modulated feedback clock that is communicated to an error detector of said frequency synthesizer circuit; and (c) further controlling said frequency synthesizer circuit with an add/phase quantity, so as to generate a more accurate instantaneous output frequency.

5. The method as recited in claim 4, wherein said signal pulse is derived from one of: (i) a Carry bit, or (ii) a Most Significant Bit of said adder circuit.

6. The method as recited in claim 5, wherein said adder circuit's output signals are latched by flip-flops, thereby creating a digital accumulator circuit.

7. The method as recited in claim 4, wherein said signal pulse is generated at substantially equal time intervals per count sequence of said adder circuit.

8. The method as recited in claim 7, wherein said add/phase quantity is varied over time, thereby causing said output frequency to change value over time.

9. The method as recited in claim 4, wherein said error detector comprises one of: a digital phase/frequency detector, an analog phase detector, a digital phase detector, an analog frequency detector, or a digital frequency detector.

10. A spread spectrum clock generating circuit, comprising:

(a) a frequency synthesizer circuit having: (i) an error detector, (ii) an oscillator output circuit, and (iii) a feedback loop that includes an adder circuit;

(b) said frequency synthesizer circuit receiving: (i) an input clock signal of a substantially constant frequency, which is in communication with said error detector, and (ii) an add/phase quantity which is in communication with said adder circuit;

(c) said adder circuit having an output that is in communication with said error detector, said output acting as a modulated feedback clock signal; and (d) a controller that is configured: (i) to control said frequency synthesizer circuit so that the oscillator output circuit generates a plurality of output frequencies over time using a predetermined spread spectrum profile, and (ii) to control said add/phase quantity so as to generate a more accurate instantaneous output frequency.

11. The clock generating circuit as recited in claim 10, further comprising at least one latch circuit that temporarily holds an output value of said adder circuit, and thereby creates said modulated feedback clock signal.

12. The clock generating circuit as recited in claim 11, wherein said modulated feedback clock signal comprises a pulse signal that is generated at substantially equal time intervals per count sequence of said adder circuit.

13. The clock generating circuit as recited in claim 12, wherein said modulated feedback clock signal comprises a pulse signal that is derived from one of: (i) a Carry bit, or (ii) a Most Significant Bit of said adder circuit.

14. The clock generating circuit as recited in claim 10, wherein said add/phase quantity is generated by an N-bit register.

15. The clock generating circuit as recited in claim 10, wherein said add/phase quantity is generated by an Add Amount Modulator circuit, which comprises: (i) an address look-up table, and (ii) a memory circuit that stores various add amount numeric quantities; wherein said memory circuit provides a varying numeric quantity to said adder circuit over time.

16. The clock generating circuit as recited in claim 15, wherein said Add Amount Modulator circuit further comprises at least one of: (i) a Base number register and a second adder circuit; (ii) a Start number register and a multiplexer; (iii) a Modulate ON input and a latching circuit; or (iv) a data input to said memory circuit in which said memory circuit comprises RAM.

17. The clock generating circuit as recited in claim 16, further comprising at least one of: (i) a Sync Input signal that resets an address in said address look-up table to a predetermined address; (ii) a Sync Output signal that synchronizes an external clock circuit to said frequency synthesizer circuit; or (iii) a Clear Accumulator signal that sets a phase remainder amount in said adder circuit to a predetermined numeric value.

18. The clock generating circuit as recited in claim 10, wherein said error detector comprises one of: a digital phase/frequency detector, an analog phase detector, a digital phase detector, an analog frequency detector, or a digital frequency detector.

* * * * *